United States Patent
Dowben

(10) Patent No.: US 6,440,786 B1
(45) Date of Patent: Aug. 27, 2002

(54) BORON-CARBIDE AND BORON RICH RHOBOHEDRAL BASED TRANSISTORS AND TUNNEL DIODES

(75) Inventor: Peter A. Dowben, Crete, NE (US)

(73) Assignee: Board of Regents, University of Nebraska-Lincoln, Lincoln, NE (US)

( * ) Notice: Subject to any disclaimer, the term of this patent is extended or adjusted under 35 U.S.C. 154(b) by 0 days.

(21) Appl. No.: 09/465,044

(22) Filed: Dec. 16, 1999

Related U.S. Application Data

(63) Continuation of application No. 08/933,962, filed on Sep. 19, 1997, now Pat. No. 6,025,611.
(60) Provisional application No. 60/026,972, filed on Sep. 20, 1996.

(51) Int. Cl.$^7$ .............................................. H01L 21/338
(52) U.S. Cl. ........................ 438/183; 438/167; 438/180; 438/478
(58) Field of Search .................................. 438/183, 181, 438/180, 167, 478

(56) References Cited

U.S. PATENT DOCUMENTS

| | | | |
|---|---|---|---|
| 3,224,913 A | 12/1965 | Ruehrwein | 148/175 |
| 3,364,084 A | 1/1968 | Ruehrwein | 148/175 |
| 3,565,703 A | 2/1971 | Kamath | 148/172 |
| 4,348,428 A | 9/1982 | Rockley | 427/54.1 |
| 4,362,766 A | 12/1982 | Dannhäuser et al. | 427/39 |
| 4,569,855 A | 2/1986 | Matsuda et al. | 427/35 |
| 4,766,482 A | 8/1988 | Smeltzer et al. | 357/23.7 |
| 4,957,773 A | 9/1990 | Spencer et al. | 427/39 |
| 5,030,583 A | 7/1991 | Beetz, Jr. | 437/39 |
| 5,061,322 A | 10/1991 | Asano | 136/258 |
| 5,070,027 A | 12/1991 | Mito et al. | 437/15 |
| 5,468,978 A | 11/1995 | Dowben | 257/258 |
| 5,632,699 A | 5/1997 | Azarian | 451/54 |
| 5,658,834 A | * 8/1997 | Dowben | |
| 5,750,231 A | 5/1998 | Alhert | 428/65.5 |

OTHER PUBLICATIONS

Boag et al., "Designing of organometallics for vapor phase metallization of plastics," *Metallized Plastics 4: Fundamental and Applied Aspects*, (Mittal, Ed.) Plenum Press: New York, pp. 1–7 (1996).

Byun et al., Heterojunction fabrication by selective area chemical vapor deposition induced by synchrotron radiation, *Appl. Phys. Lett.*, vol. 64, pp. 1968–1970 (1994).

Byun et al., "Synchrotron radiation induced decomposition of closo–1,2–dicarbadodecaborane," *Jpn. J. Appl. Phys.*, vol. 34, Part 2, No. 7B, pp. L941–L944 (1995).

(List continued on next page.)

*Primary Examiner*—Kevin M. Picardat
*Assistant Examiner*—D. M. Collins
(74) *Attorney, Agent, or Firm*—Suiter & Associates; Scott C. Rand; William J. Breen, II

(57) ABSTRACT

The present invention relates to the fabrication of a boron carbide/boron semiconductor devices. The results suggest that with respect to the approximately 2 eV band gap pure boron material, 0.9 eV band gap boron carbide ($B_5C$) acts as a p-type material. Both boron and boron carbide ($B_5C$) thin films were fabricated from single source borane cage molecules using plasma enhanced chemical vapor deposition (PECVD). Epitaxial growth does not appear to be a requirement. We have doped boron carbide grown by plasma enhanced chemical vapor deposition. The source gas close-1,2-dicarbadecaborane (orthocarborane) was used to grow the boron carbide while nickelocene (Ni($C_5H_5$)2) was used to introduce nickel into the growing film. The doping of nickel transformed a $B_5C$ material p-type relative to lightly doped n-type silicon to an n-type material. Both p-n heterojunction diodes and n-p heterojunction diodes with n- and p-type Si [1,1,1] respectively. With sufficient partial pressures of nickelocene in the plasma reactor diodes with characteristic tunnel diode behavior can be successfully fabricated.

23 Claims, 8 Drawing Sheets

OTHER PUBLICATIONS

Byun et al., "Composition of different chemical vapor deposition methodologies for the fabrication of heterojunction boron–carbide diodes," *Nanostructured Materials*, vol. 5, pp. 465–471 (1995).
Callahan et al., "Ten years of Metallocarboranes," *Adv. Organometallic Chem.*, vol. 14, pp. 145–186 (1976).
Carpinelli et al., "Scanning tunneling microscopy study of intermediates in the dissociative adsorption of closo–1,2–dicarbadodecaborane on Si(111)," *J. Vacuum Sci. & Tech. B*, vol. 13(3), pp. 1203–1206 (1995).
Cava et al., "Stabilization of superconducting $LnPt_2B_2C$ by partial substitution of gold for platinum," *Physica C*, vol. 226, pp. 170–174 (1994).
Cava et al., "Superconductivity in the quaternary intermetallic compounds $LnNi_2B_2C$," *Nature*, vol. 367, pp. 252–253 (1994).
Chauvet et al., "Spin susceptibility of boron carbides: dissociation of singlet small bipolarons," *Phys. Rev. B*, vol. 53(21), pp. 14450–14457 (1996).
Chynoweth et al., "Excess tunnel current in silicon Esaki junctions," *Phys. Rev.*, vol. 121, pp. 684–694 (1961).
Claassen, "Excess and hump current in Esaki diodes," *J. Appl. Phys.*, vol. 32, pp. 2372–2378 (1961).
Dowben et al., "Nickel doping of boron carbide and Fermi level shifts," pp. 1–6, unpublished manuscript.
Epstein et al., "Lithium–doped gallium arsenide tunnel diodes," *J. Appl. Phys.*, vol. 35, pp. 3050–3051 (1964).
Hawthorne et al. "π–Dicarbollyl derivatives of the transition metals. Metallocene analogs," *J. Am. Chem. Soc.*, vol. 90, pp. 879–896 (1968).
Hitchcock et al., "Inner–shell excitation of boranes and carboranes," *J. Phys. Chem.*, vol. 97, pp. 8171–8181 (1993).
Hitchcock et al., "Inner–shell excitation of spectroscopy of closo–carboranes," *J. Phys. Chem. B*, vol. 101, pp. 3483–3493 (1997).
Hwang et al., "Fabrication of boron–carbide/boron heterojunction devices," *Appl. Phys. Lett.*, vol. 68(11), pp. 1495–1497 (1996).
Hwang et al., "Nickel doping of boron carbide grown by plasma enhanced chemical vapor deposition," *J. Vacuum Sci. & Tech. B*, vol. 14(4), pp. 2957–2960 (1996).
Hwang et al., "Phosphorus doping of boron carbon alloys," *Mat. Res. Soc. Symp. Proc.*, vol. 452, pp. 1031–1036 (1997).
Hwang et al., "Fabrication of n–type nickel doped $B_5C_{1+\delta}$ homojunction and heterojunction diodes," *Appl. Phys. Lett.*, vol. 70(8), pp. 1028–1030 (1997).
Kane, "Theory of tunneling," *J. Appl. Phys.*, vol. 32, pp. 83–91 (1961).
Karlovsky, "The curvature coefficient of germanium tunnel and backward diodes," *Solid State Electron*, vol. 10, pp. 1109–1111 (1967).
Kim et al., "Chemical vapor deposition of bron and boron nitride from decaborane(14)," *J. Vacuum Sci. & Tech. A*, vol. 7(4), pp. 2796–2799 (1989).
Kim et al., "Fabricating magnetic Co–Ni–C thin–film alloys by organometallic chemical vapor deposition," *J. Appl. Phys.*, vol. 70, pp. 6062–6064 (1991).
Kobayashi et al., "Thermal and ion beam induced reactions in Ni thin films on BP(100)," *Appl. Phys. Lett.*, vol. 54, pp. 1914–1915 (1989).
Kobayashi et al., "Thermal and ion beam induced reactions in Ni on BP," *Mater. Res. Soc. Sympp. Proc.*, vol. 162, pp. 595–600 (1990).
Kuhlmann et al., IR optical properties of Fe–doped β–rhombohedral boron, *AIP Conf. Proc.*, vol. 231 (Boron–Rich Solids), pp. 340–343 (1991).
Kuhlmann et al., Influence of interstitially soluted iron on structural, optical and electrical properties of β–rhombohedral boron, *J. Alloys and Compounds*, vol. 186, pp. 187–200 (1992).
Kuhlmann et al., "Ionization of interstitial iron atoms in β–rhombohedral boron," *Phys. Stat. Sol.*, vol. 187, pp. 43–59 (1995).
Lee et al., "Characterization of boron carbide thin films fabricated by plasma enhanced chemical vapor deposition from boranes," *J. Appl. Phys.*, vol. 72(10), pp. 4925–4933 (1992).
Lee et al., "Conductance in microcrystalline $B_{1-x}C_x$/Si heteorjunction diodes," *Mater. Res. Soc. Symp. Proc.*, vol. 283, pp. 483–488 (1993).
Lee et al., "The structural homogeneity of boron carbide thin films fabricated using plasma–enhanced chemical vapor deposition from $B_5H_9+CH_4$," *J. Appl. Phys.*, vol. 74(11), pp. 6919–6924 (1993).
Lee et al., "The properties of boron carbide/silicon heterojunction diodes fabricated by plasma–enhanced chemical vapor deposition," *J. Appl. Phys.*, vol. A58, pp. 223–227 (1994).
Lewis et al., "Chemical vapor deposition of boron–carbon films using organometallic reagents," Mat. Lett., vol. 27, pp. 327–332 (1996).
Logan et al., "Effect of degenerate semiconductor band structure on current–voltage characteristics of silicon tunnel diodes," *Phys. Rev.*, vol. 131, pp. 89–95 (1963).
Lund et al., "Boron phosphide on silicon for radiation detectors," *Mat. Sci. Soc. Symp. Proc.*, vol. 162, pp. 601–604 (1990).
McIlroy et al., "The coadsorption of metals and molecular icosahedra on Cu(100)," *Surface Science*, vol. 328, pp. 47–57 (1995).
McIlroy et al., "Band gaps of doped and undoped films of molecular icosahedra," *Mat. Sci. Eng.*, vol. A217/218, pp. 64–68 (1996).
McIlroy et al., "The incorporation of nickel and phosphorous dopants into boron–carbon alloy thin films," *Applied Physics A*, vol. 67, pp. 335–342 (1998).
Mazurowski et al., "Novel methods for deposition of boron carbide films," in *Plasma Processing and Synthesis of Materials, MRS Symposium Proceedings*, (Applian et al., Eds.) MRS: Pittsburgh, PA, vol. 190, pp. 101–106 (1991).
Mazurowski et al., "Characterization of boron carbide films formed by PECVD," in *Wide Band Gap Semiconductors, MRS Symposium Proceedings*, (Moustakas et al., Eds.) MRS: Pittsburgh, PA, vol. 242, pp. 637–642 (1992).
Meyerhofer et al., "Degenerate germanium. I. Tunnel, excess, and thermal current in tunnel diodes," *Phys. Rev.*, vol. 126, pp. 1329–1341 (1962).
Minton et al., "Theoretical and experimental analysis of germanium tunnel diode characteristics," *Solid State Electron*, vol. 7, pp. 491–500 (1964).
Nagarajan et al., "Bulk superconductivity at an elevated temperature ($T_c \approx 12$ K) in a nickel containing alloy system Y–Ni–B–C," *Phys. Rev. Lett.*, vol. 72, pp. 274–277 (1994).
Perkins et al., "Synchrotron–radiation–induced deposition of boron and boron carbide films from boranes and carboranes: decaborane," *J. Appl. Phys.*, vol. 69, pp. 4103–4109 (1991).

Perkins et al., "Demonstrating the utility of boron based precursor molecules for selective area deposition in a scanning tunnelling microscope," *Mat. Res. Soc. Symp. Proc.*, vol. 236, pp. 153–158 (1992).

Perkins et al., "Synchrotron–radiation–induced deposition of boron and boron carbide films from boranes and carboranes II: nido–2,3–diethyl–2,3–dicarbahexaborane," *Applied Physics A*, vol. 54, pp. 442–450 (1992).

Rosenberg et al., "Selective area deposition of boron on Si(111) induced by synchrotron radiation," *Appl. Phys. Lett.*, vol. 58(11), pp. 607–609 (1991).

Rosenberg et al., "Selective area, synchrotron radiation induced. delta doping of silicon," *J. Appl. Phys.*, vol. 71(10), pp. 4795–4798 (1992).

Shiomi et al., "High–voltage schottky diodes on boron–doped diamond epitaxial films," *Japanese Journal of Applied Physics*, vol. 29(12), pp. L2163–L2164 (1990).

Siegrist et al., "The crystal structure of superconducting $LuNi_2B_2C$ and the related phase LuNiC," *Nature*, vol. 367(20), pp. 254–256 (1994).

Stauf et al., "Iron and nickel thin film deposition via metallocene decomposition," *Thin Solid Films*, vol. 153, pp. 421–430 (1987).

Stauf et al., "Patterned photoassisted organometallic deposition of iron, nickel and palladium on silicon," *Thin Solid Films*, vol. 156, pp. L31–L36 (1988).

Thornber et al., "The tunneling time of an electron," *J. Appl. Phys.*, vol. 38(5), pp. 2384–2385 (1967).

Warren et al., "Metallocene analogs of copper, gold, and palladium derived from the (3)–1,2–dicarbollide ion," *J. Am. chem. Soc.*, vol. 90(18), pp. 4823–4828 (1968).

Warren et al., "The chemistry of the bis[π–(3)–1,2–dicarbollyl] metallates of nickel and palladium," *J. Am. Chem. Soc.*, vol. 92(5), pp. 1157–1173 (1970).

Werheit et al., "Structural and electronic properties of carbon doped β–rhombohedral boron," *Phys. Stat. Sol. (b)*, vol. 179, pp. 489–511 (1993).

Werheit et al., "Solid solutions of silicon in boron–carbide–type crystals," *J. of Alloys and Compounds*, vol. 209, pp. 181–187 (1994).

Werheit, "Boron–rich solids: a chance for high–efficiency high–temperature thermoelectric energy conversion," *Mat. Sci. Soc. Eng.*, vol. B29, pp. 228–232 (1995).

Widder et al., "Dielectric function of $YNi_2B_2C$ between 10 meV and 50 eV," *Europhys. Lett.*, vol. 30(1), pp. 55–60 (1995).

Zych et al., "Novel methods for the fabrication of ferromagnetic nickel and nickel boride thin films," *J. Appl. Phys.*, vol. 76(6), pp. 3684–3687 (1994).

* cited by examiner

US 6,440,786 B1

BORON-CARBIDE AND BORON RICH RHOBOHEDRAL BASED TRANSISTORS AND TUNNEL DIODES

RELATED APPLICATIONS

This application is a continuation in part of U.S. application Ser. No. 08/933,962, filed Sep. 19, 1997, now U.S. Pat. No. 6,025,611, which claims priority under 35 U.S.C. §119(e) to provisional application Ser. No. 60/026,972, filed Sep. 20, 1996. Each of said applications is incorporated herein by reference in its entirety.

GOVERNMENT RIGHTS

This work resulted in part from research conducted under U.S. Air Force grant AFOSR F49620-94-1-0433. The government has certain rights in this invention.

BACKGROUND OF THE INVENTION

The present invention relates to a process for the deposition of boron carbide semiconductor material, and also to semiconductor devices formed by deposition of a boron carbide film. The invention is more particularly directed to a technique for creating a layer of boron carbide with a boron-to-carbon ratio of about 5. The invention is also particularly directed to semiconductor devices produced by this technique.

Boron and boron carbide devices have been sought since 1959 [1] but only recently has the fabrication of these devices been realized [2, 3]. Such devices would have applicability in a wide number of harsh conditions. For example, they should be resistant to corrosive, high temperature, and mechanically abrasive environments. Because of the large neutron capture cross-section, these materials could be used in devices in radioactive environments as well [4].

Techniques are known for forming boron-rich carbides. These techniques may employ alkanes and heavy boron cage molecules to deposit boron carbide thin films. Plasma-enhanced chemical vapor deposition (PECVD) can be employed to fabricate boron carbide films without resort to high temperatures or high pressures. These technique typically employ a halide of boron, e.g., $BCl_3$, $BBr_3$ or $BI_3$. Most recently boranes, such as nido-decaborane and nido-pentaborane have gained interest, because these compounds are safe and stable, yet produce a vapor pressure of several Torr at room temperature. However, until very recently, only low-resistivity boron carbide materials could be produced, i.e., materials with resistivities on the order of about ten ohm-cm at room temperature. Boron carbide material of this type has an extremely low band gap, and is not suited as a semiconductor material.

At the same time, boron carbide has become an attractive material because of its inherent hardness and durability. Boron carbide, like other boron-containing materials, has been considered for high temperature electronic devices because it retains its useful characteristics at elevated temperatures. For example, boron carbide is known to have a melting temperature of 2350° C., a strength of 50 ksi, a hardness of 2800 $kg/mm^2$, and a thermal conductivity of 0.22 cal/cm/sec/° C./cm. Diamond and silicon carbide have been investigated because of their good thermal and mechanical characteristics, and because of their wide band gaps. However, these materials have not yet proven cost effective.

Recent successes in construction of boron carbide/n-Si [1,1,1] heterojunction diodes [5, 6] have demonstrated that boron carbide/Si [1,1,1] heterojunction diodes can be fabricated from close-1,2-dicarbadodecaborane ($C_2B_{10}H_{12}$; orthocarborane) by using synchrotron radiation induced chemical vapor deposition (SR-CVD) [5, 6], and plasma enhanced chemical vapor deposition (PECVD) [2, 3, 5–7]. Pure boron films also had been deposited on silicon from nido-decaborane ($B_{10}H_{14}$; decaborane) by using SR-CVD [8, 9]. Boron carbide/n-Si [1,1,1] heterojunction devices fabricated by depositing boron carbide from nido-pentaborane and alkanes using PECVD is shown and described in U.S. Pat. No. 5,468,978, hereby incorporated by reference in its entirety.

SUMMARY OF THE INVENTION

It is an object of the present invention to provide boron/boron carbide and doped boron carbide semiconductor devices and techniques to fabricate same.

It is another object of the present invention to provide a semiconductor device suited for use in high temperature, corrosive, mechanically abrasive, or radioactive environments.

Another object of the present invention is to provide boron carbide semiconductor devices and fabrication techniques which do not require a silicon interface.

Yet another object of the present invention is to provide boron carbide semiconductor devices and fabrication techniques to fabricate same which do not depend on epitaxial growth or crystallite size.

Still another object of the present invention is to provide doped boron carbide semiconductor devices and fabrication techniques for making same. In one embodiment, the doped boron carbide appears as n-type relative to an n-type silicon substrate.

The objects of the present invention are provided by the boron/boron carbide heterojunction devices and the doped boron carbide/silicon semiconductor devices and fabrication techniques as disclosed herein.

The fabrication of several working boron/boron carbide semiconductor devices is described herein. In an effort to fabricate a more sophisticated device, a transistor was made in a PECVD system. A diode was made directly on an aluminum substrate to demonstrate that a silicon interface is not essential for fabrication of a boron carbide device. The use of plasma enhanced chemical vapor deposition (PECVD) provides a means for fabricating boron and boron carbide thin films successfully in a high resistivity form [2, 3]. The present invention addresses some of the issues associated with making devices of increasing complexity from boron carbide.

The aluminum substrates were polycrystalline, and the silicon substrates were [1,1,1], n-type. Both were chemically etched and cleaned prior to insertion in vacuo and set on the lower electrode. The substrates were further cleaned by $Ar^+$ bombardment at 300 mTorr, 40 W and annealed at 400° C. in the vacuum system. Deposition was carried out in a custom designed parallel plate 13.56 MHZ radio-frequency plasma enhanced chemical vapor deposition (PECVD) reactor described previously [3, 7]. A suitable plasma chamber in which this technique can be carried out is shown and described in U.S. Pat. No. 4,957,773, hereby incorporated by reference in its entirety.

The above, and many other objects and advantages of the present invention will become apparent from the ensuing detailed description of the invention, to be read in conjunction with the accompanying drawings.

DETAILED DESCRIPTION OF THE INVENTION

Figure 1A:
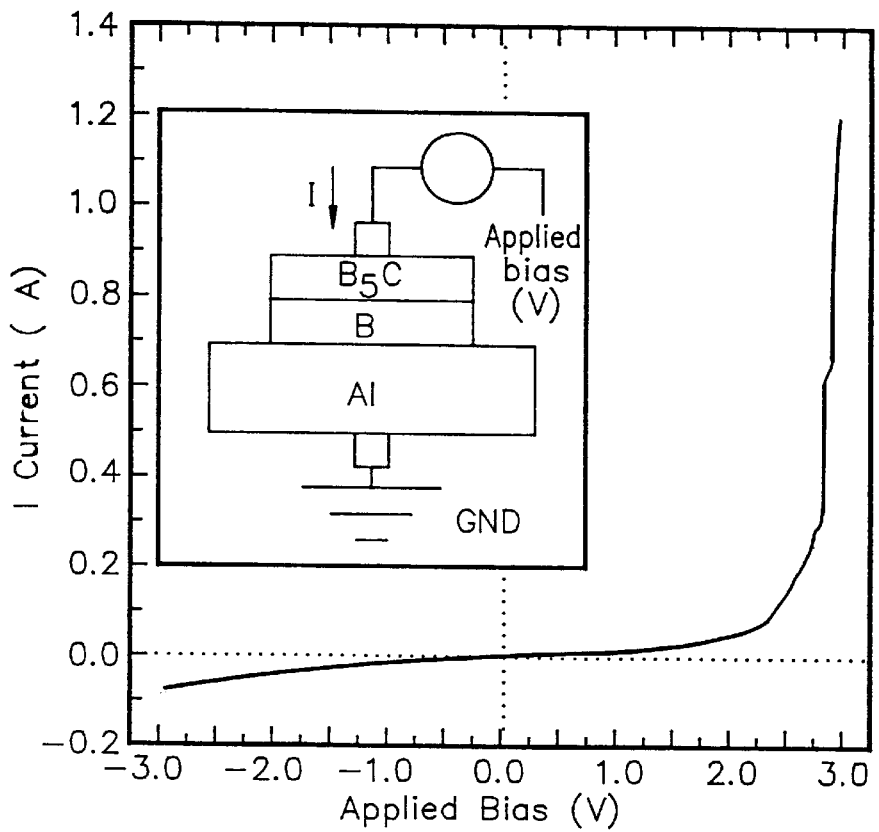
FIG. 1a is a graph of diode I-V characteristics of a boron carbide/boron/aluminum device according to the present invention with a schematic cross sectional view of the diode structure and wire connections for characteristics shown in the inset.

Using CVD sources, boron carbide/boron multilayers were deposited on aluminum and silicon. FIG. 1a shows the schematic cross-sectional view of the fabricated multilayer devices. Decaborane was used to form a pure boron film on the substrates. Boron carbide ($B_5C$) films were then deposited on the pure boron layer from orthocarborane. The purity of the orthocarborane and decaborane was determined by infrared (IR), nuclear magnetic resonance (NMR) and mass spectral measurements (purity 98%) and compared with literature values [10]. Less than 1% of the metacarborane and paracarborane isomers were found to be present. The decaborane was sublimed to separate the source material from cellite (a stabilizer) and other impurities [10].

Figure 1B:
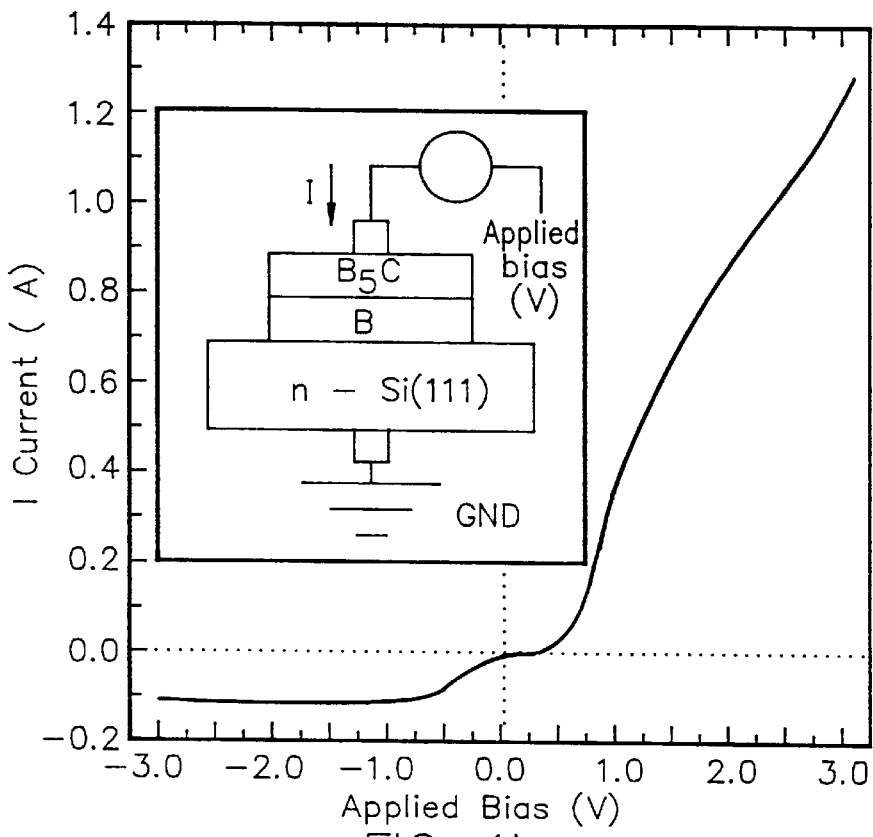
FIG. 1b is a graph of diode I-V characteristics of a boron carbide/boron/n-Si [1,1,1] device according to the present invention with a schematic cross-sectional view of the diode structure and electrical wire connections for characteristics shown in the inset.

The diode I-V characteristics of a $B_5C$/boron/aluminum structure are seen in FIG. 1a. Although not shown here, a boron/aluminum structure exhibits an ohmic characteristic, which leads to the conclusion that a junction exists between the $B_5C$ and boron with the $B_5C$ acting as the p-type material. The I-V diode characteristics of a $B_5C$/boron/n-type silicon structure are seen in FIG. 1b. In this case the boron/n-type silicon structure, which is not shown, exhibits a diode characteristic with the boron acting as a p-layer with respect to the n-type silicon. This result, combined with results of FIG. 1a and the boron/aluminum structure indicate the $B_5C$/boron/n-type silicon structure consists of two diodes in series oriented in the same direction. This is borne out by the observed diode curve in FIG. 1b. Furthermore, neither structure exhibits the classical exponential diode behavior in the forward direction. This type of behavior is similar to the previously reported boron carbide/n-type Si [1,1,1] heterojunction [2, 3]. It has been demonstrated that boron carbide thin film on n-type Si [1,1,1] heterojunction diodes are insensitive to the morphology of the film [6]. The semiconductor properties of the material do not appear to depend upon crystallite size and the extent of long range order, and similar material can be grown on other substrates such as silver, Si [1,1,1], and titanium.

Figure 2A:
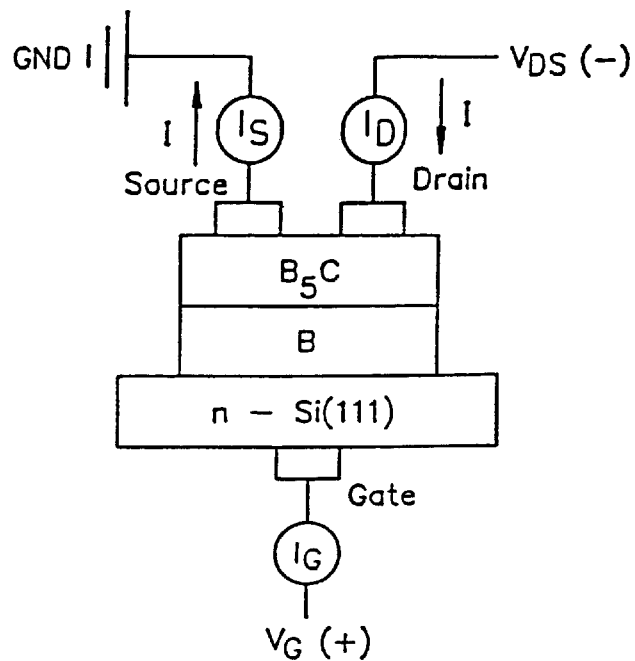
FIG. 2a shows the schematic cross-sectional geometry of fabricated boron carbide junction field-effect transistor [JFET] according to the present invention. The schematic also illustrates electrical wire connections as well as polarities of each applied biases.
Figure 2B:
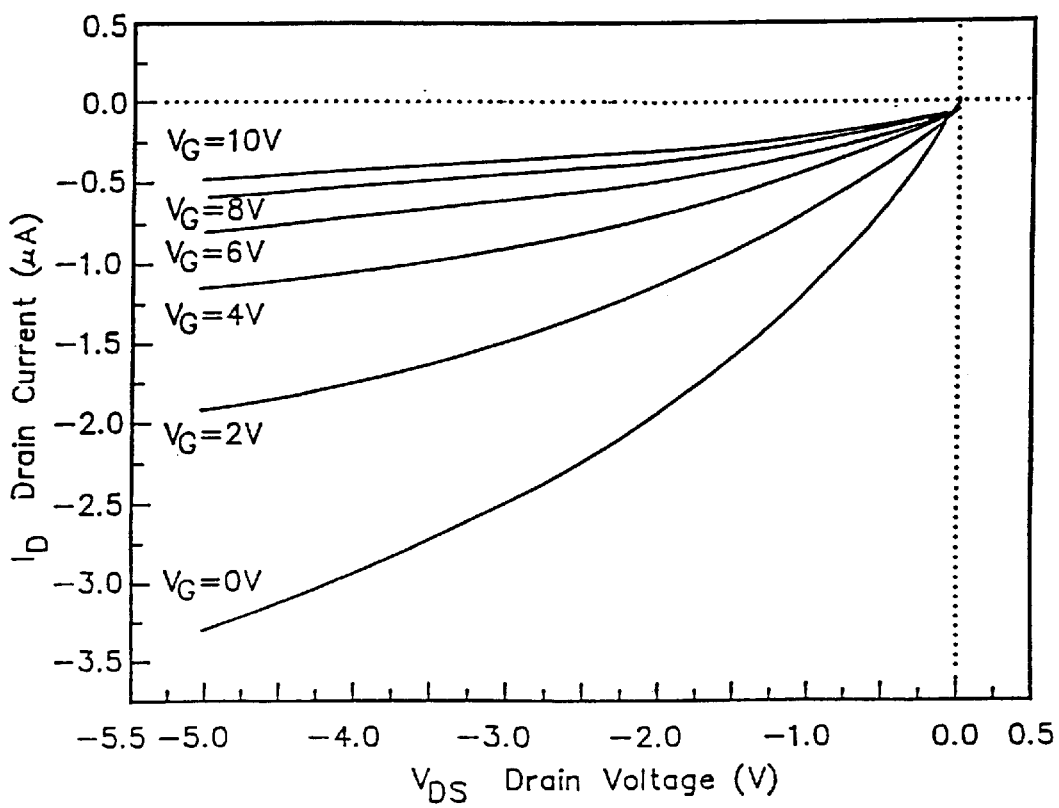
FIG. 2b shows transistor characteristics of $I_D$ (drain current) vs. $V_{DS}$ for the device shown in FIG. 2a. Gate voltage, $V_G$, was applied from 0 V to 10 V by the step of 2 V.

The fabricated boron carbide/boron/silicon multilayer device can be employed as a junction field effect transistor (JFET). FIG. 2a shows the schematic diagram of the measurement circuit, while FIG. 2b shows the drain current vs. drain voltage, with the source at ground, as a function of the gate voltage. Based on the characteristics of FIG. 1b, the gate is biased positive, while the drain is swept through negative voltages, each with respect to the grounded source. As the gate voltage is increased, the magnitude of the drain current decreases for any given value of drain voltage, which is the expected behavior for a JFET. It should be pointed out that the device does not saturate, nor does it completely cut off. This is probably a result of the fact that this is a single junction device, and the junction is relatively far removed from the source and drain region.

Figure 3:
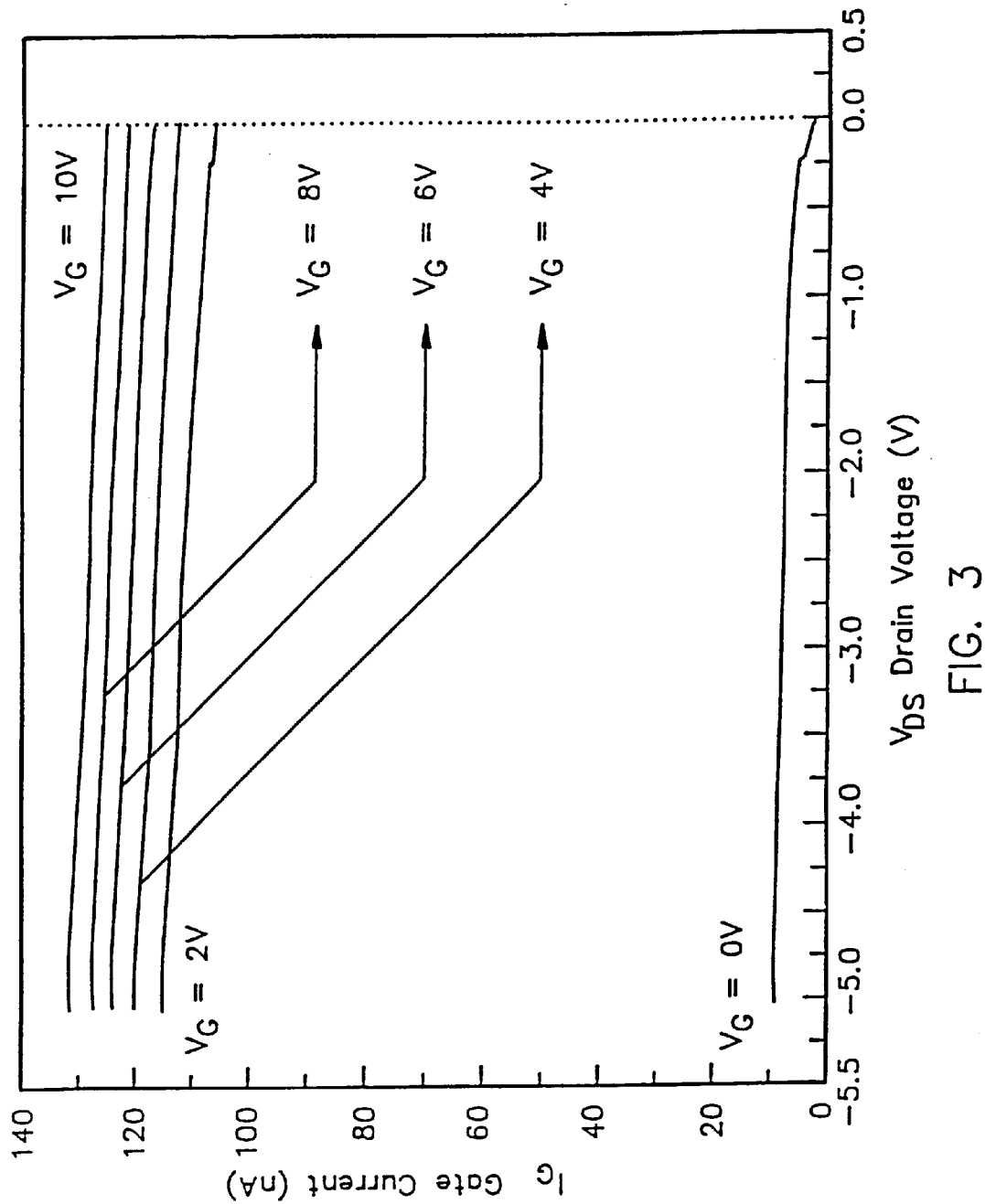
FIG. 3 shows the transistor characteristics of $I_G$ (gate current) vs. $V_{DS}$ for the device shown in FIG. 2a. Note that, relative to FIG. 2, the currents are small.

FIG. 3 is the gate current vs. drain voltage as a function of gate voltage. When combined with FIG. 2b, this clearly indicates the leakage current is less than 10% of the drain current.

Diodes fabricated from boron carbide with crystallites of different sizes (30 Å, 100 Å and 240–340 Å) have been compared [6]. While the ideality factors of these diodes do differ, similar rectifying diodes were fabricated [6] to the ones shown in this work. It is believed that this insensitivity to crystal grain size and the clear evidence that devices can be fabricated on very different substrates provides some evidence that epitaxial growth is not a determining issue in the fabrication of devices made with this microcrystalline or polycrystalline semiconductor material.

The fabrication of heterojunction devices from plasma enhanced [11–14] and synchrotron radiation [14, 15] chemical vapor deposition is possible from decomposition of cluster borane molecules. In fact, not only have diodes been fabricated, but a field effect transistor as well [13]. Nonetheless, no intentional doping of this material grown by plasma enhanced chemical vapor deposition (PECVD) has been attempted successfully prior to this work.

Attempts to dope films of the molecular icosahedra closo-1,2-dicarbadodecaborane (orthocarborane) have not been uniformly successful. Such molecular films can be doped with sodium [16, 17], but not the more common dopant mercury [16]. Since the suitability of orthocarborane ($C_2B_{10}H_{12}$) for the chemical vapor deposition of a boron carbide film suitable for making devices has been established [13, 15], these results suggest that doping of this material may be a complex process.

Nonetheless, nickel is a very promising dopant for the boron rich solids. A molecular nickel carborane complex has been synthesized by inorganic chemists [18] and the inclusion of nickel in other boron rich solids is well established. Nickel is a common component in the boron carbide superconductors [19] and the reactions of nickel with boron phosphide have been investigated [20, 21]. Nickelocene, Ni $(C_5H_5)_2$ has been shown to be a suitable source compound for the deposition of nickel containing thin films [22]. Nickelocene is volatile and far less toxic than nickel carbonyl, though a number of other nickel containing organometallic compounds may be suitable [23]. Since both orthocarborane and nickelocene are easily sublimed from the solid, introduction of suitable mixtures into the plasma reactor can be readily accomplished.

The p-n and n-p heterojunctions were formed by depositing boron carbide thin films on n-type and p-type Si[1,1,1] substrates respectively, doped to $7 \times 10^{14}/cm^3$, following procedures described in detail elsewhere [11, 12]. The Si [1,1,1] substrates surfaces were prepared by $Ar^+$ ion sputtering in the plasma reactor. Deposition of the films was performed in a custom designed parallel plate 13.56 MHZ radio-frequency PECVD reactor used in previous studies [11–12]. The source molecule gas closo-1,2-dicarbadecaborane (ortho-carborane) was used to grow the boron carbide while nickelocene ($Ni(C_5H_5)_2$) was used to introduce nickel into the growing film. Other dopants can be introduced using other metallocenes, including, for example, chromium (chromocene), manganese (manganocene), iron (ferrocene), cobalt (cobaltocene), and ruthenium (ruthenocene). Like organometallic compounds can be used to extend the range of dopants even further.

In still further embodiments, the boron carbide layer is doped with phosphorous. In one embodiment, phosphorous doped boron carbon alloy films were made by chemical vapor deposition from a single source compound, dimeric chloro-phospha(III)carborane (($C_2B_{10}H_{10})_2(PCl)_2$) and the resulting phosphorous doped $B_5C$ materials exhibited increases in the band gap from 0.9 eV to 2.6 eV. Other methods of phosphorous inclusion may also be employed, and will also increase the band gap substantially.

Figure 4A:
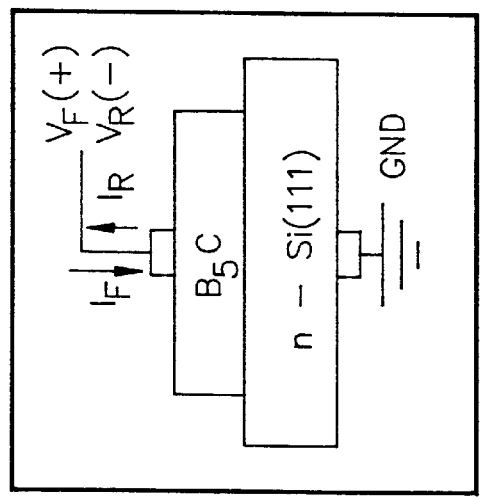
FIG. 4a shows the schematic cross-sectional geometry of a boron carbide/n-Si [1,1,1] heterojunction and a graph of diode I-V characteristics for the device shown.
Figure 4A:
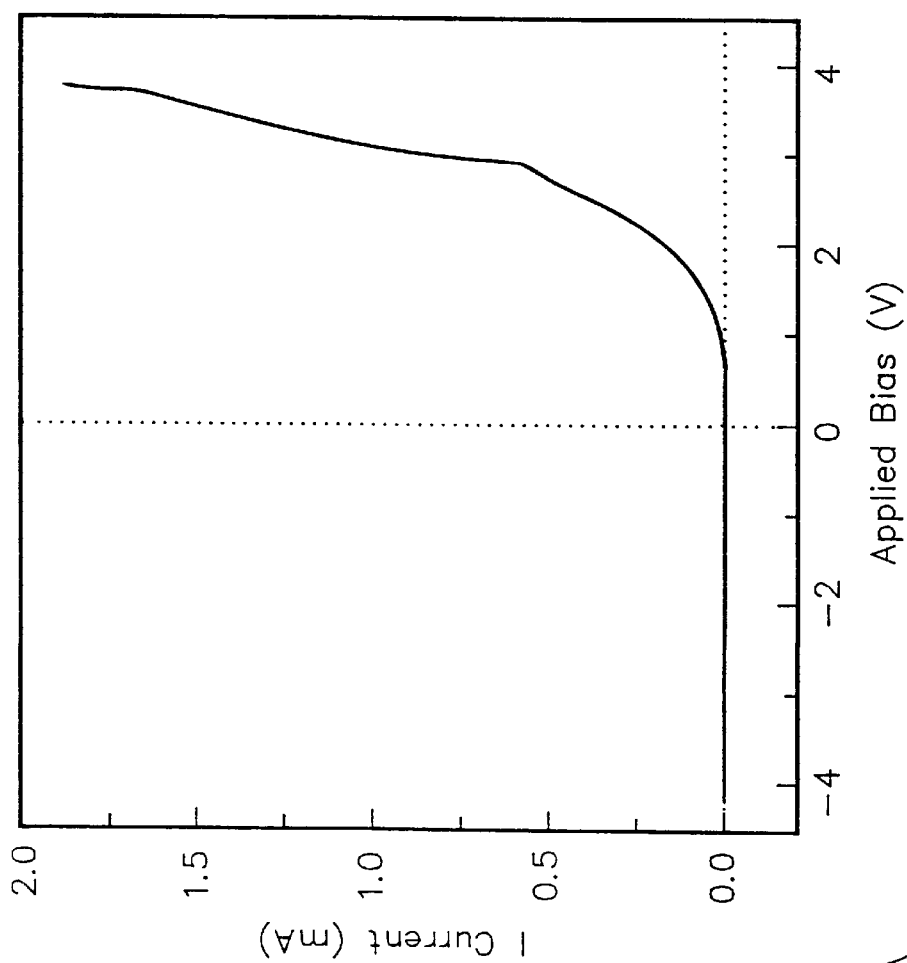
Figure 4B:
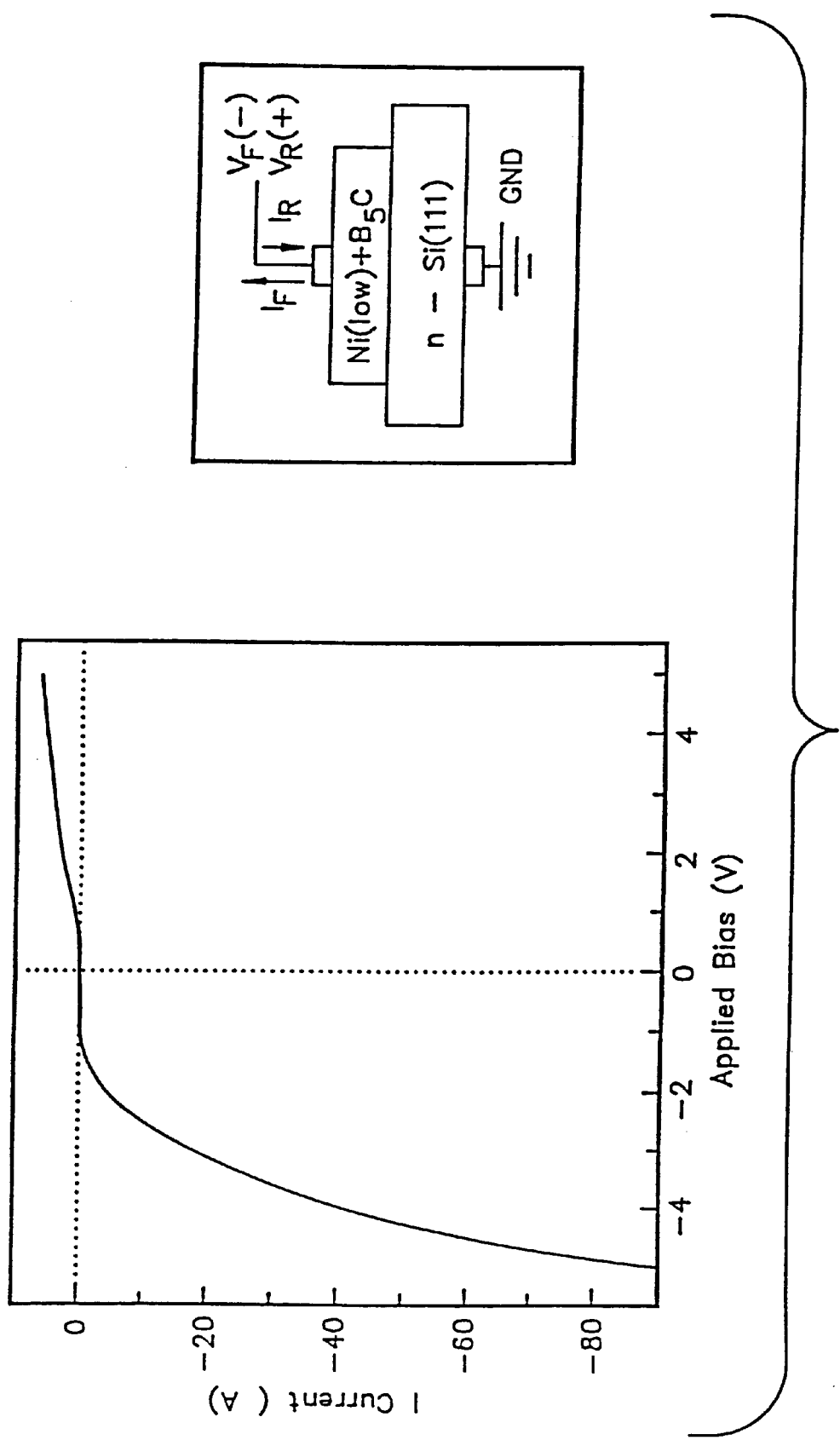
FIG. 4b shows the schematic cross-sectional geometry of the high nickel doped boron carbide/n-Si [1,1,1] heterojunction according to the present invention and a graph of diode I-V characteristics for the device shown.

Typical boron carbide/n-type silicon heterojunctions have been routinely formed by this technique [11–14] as seen in FIG. 4a. With inclusion of nickelocene as an additional source gas, nickel was included in the growing boron carbide thin film. The presence of nickel at high doping levels was established by Auger electron spectroscopy employing a cylindrical mirror analyzer (Perkin Elmer double pass CMA) as the electron energy analyzer. Several different partial pressures of nickelocene were employed. Low relative partial pressures of nickelocene to orthocarborane during film growth (<0.1) resulted in the heterojunction diode shown in FIG. 4b while higher partial pressure ratios (about 9) resulted in the heterojunction diode shown in FIG. 4c.

Figure 5A:
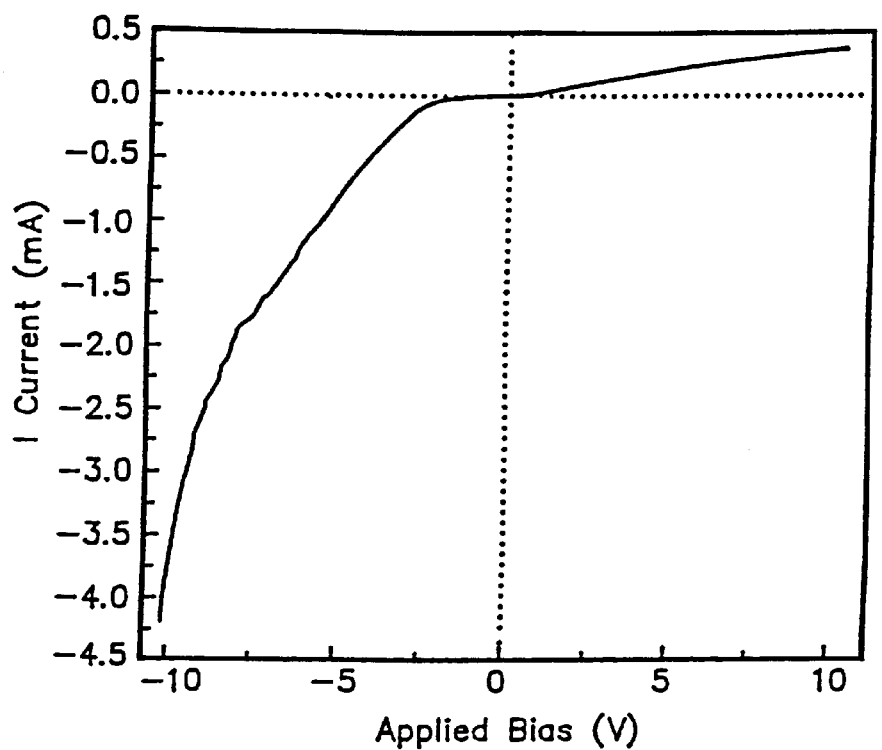
FIG. 5a shows a graph of I-V diode characteristics a nickel doped boron carbide heterojunction diode, with low nickel doping concentrations, according to the present invention.

The consequence of inclusion of nickelocene with orthocarborane as a source gas, the normally p-type boron carbide, relative to the n-type silicon, results in the formation of rectifying diodes with reverse bias. Thus the nickel doped boron carbide heterojunction diodes appears n-type relative to the lightly doped n-type silicon substrate. This is consistent with the fabrication of n-p heterojunctions diodes on p-type silicon, again by including nickelocene with the orthocarborane as an additional source gas, as seen in FIG. 5a.

Figure 4C:
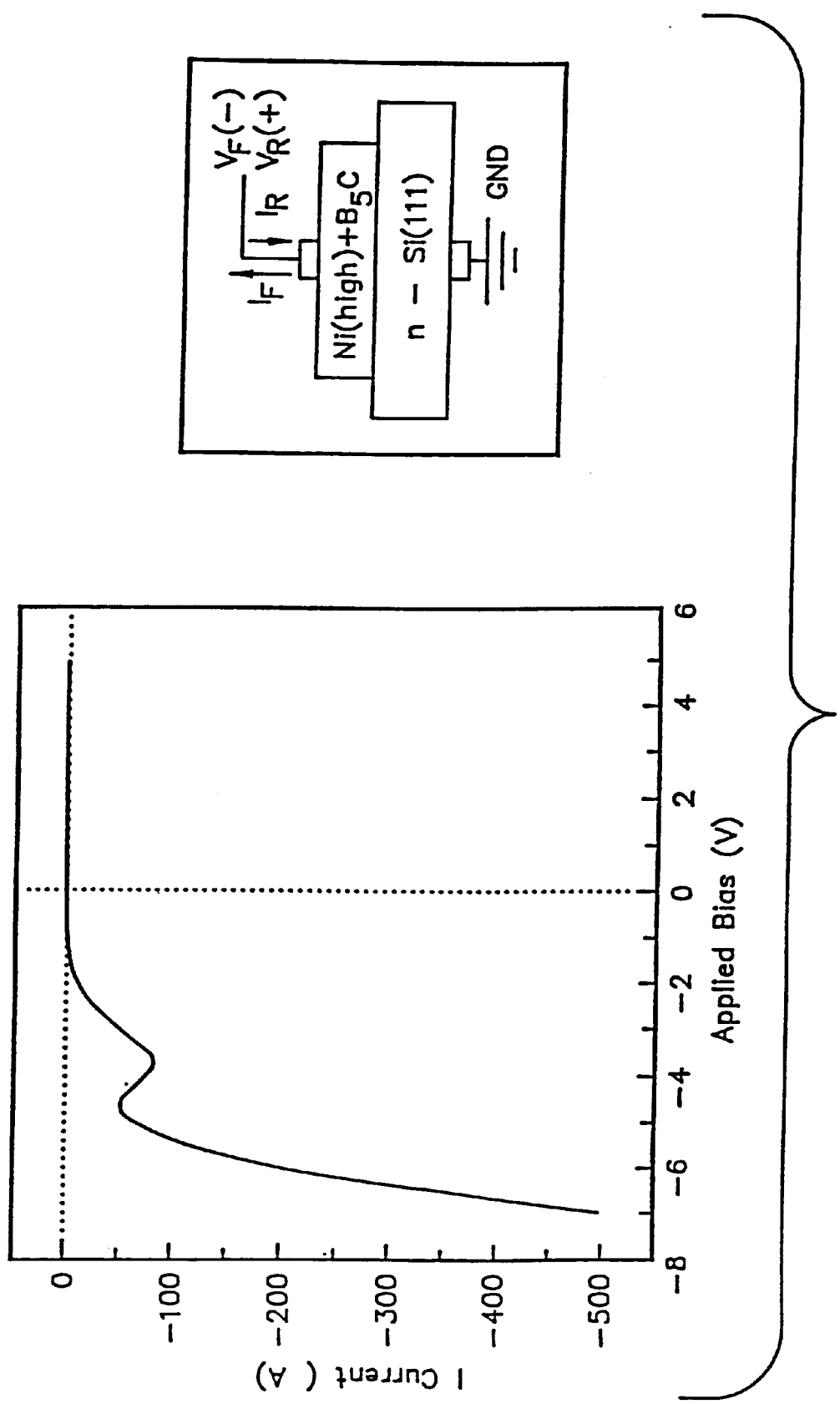
FIG. 4c shows the schematic cross-sectional geometry of the low nickel doped boron carbide/n-Si [1,1,1] heterojunction according to the present invention and a graph of diode I-V characteristics for the device.
Figure 5B:
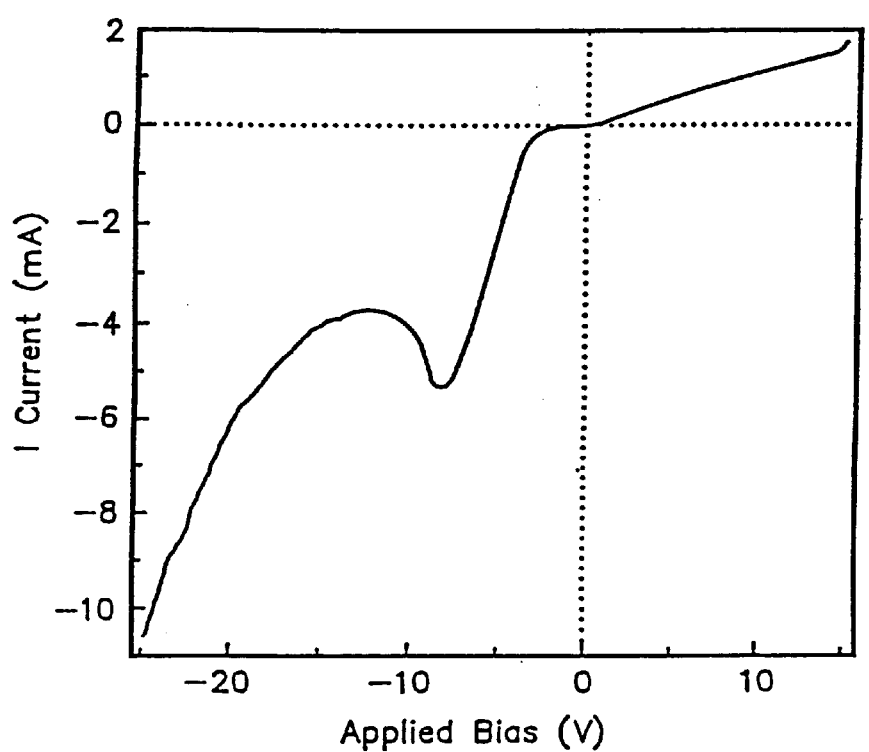
FIG. 5b shows a graph of I-V diode characteristics a nickel doped boron carbide heterojunction diode, with high nickel doping concentrations, according to the present invention.

With the higher nickel doping levels, a negative differential resistance or a valley current in the effective forward bias direction fordiodes formed on both n-type silicon and p-type silicon substrates is apparent as seen in FIGS. 4c and 5b. This behavior is characteristic of a tunnel diode [24]. This is consistent with degenerative doping of a pinned state relative to the conduction band edge.

States pinned to one band edge have been proposed for boron carbide [22] and have been identified pinned to conduction band edge [25, 26]. The hump in the current occurs with at a larger bias voltage for the tunnel diodes fabricated on the p-type silicon. This consistent with the boron carbide thin film acting as an n-type layer and the formation of heterojunction n-p diodes. See also [27].

Figure 6:
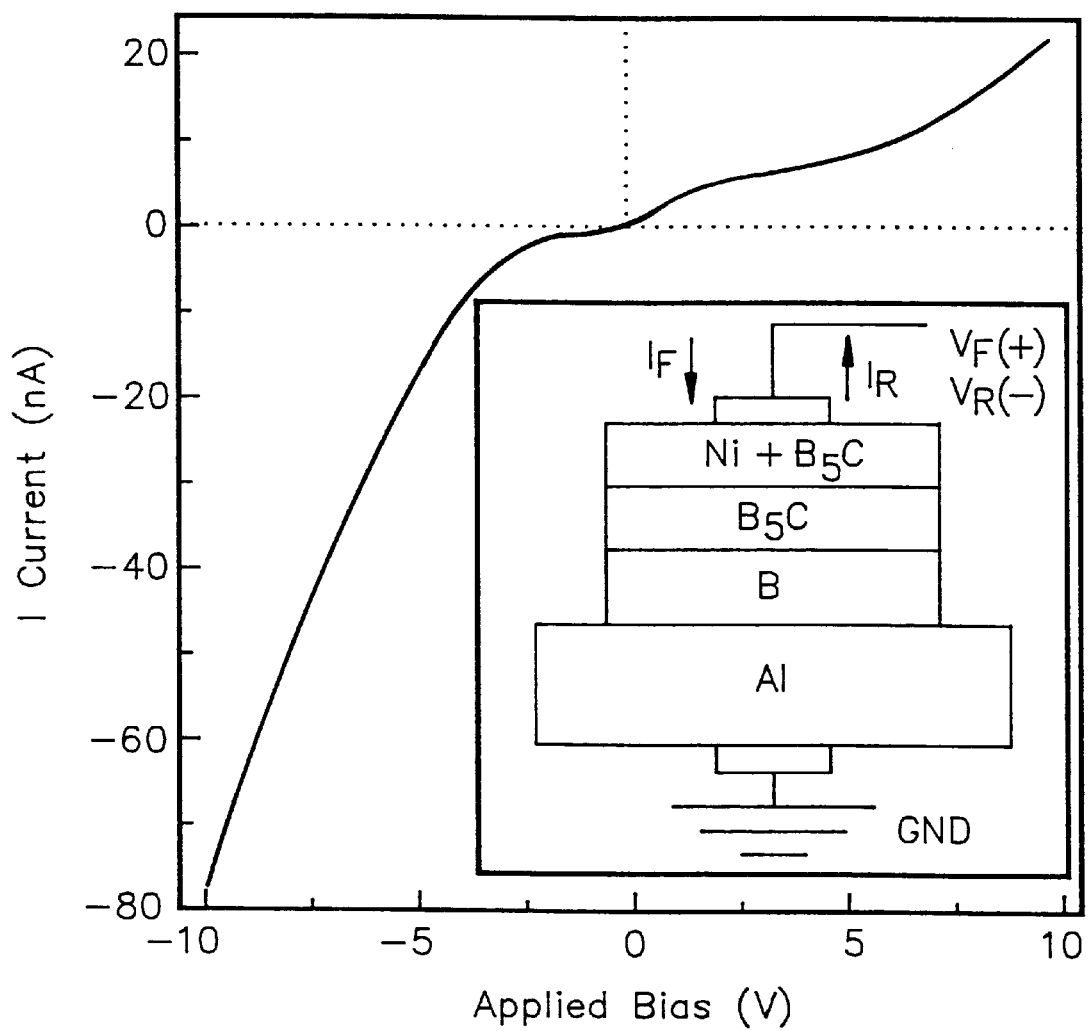
FIG. 6 is a graph of diode I-V characteristics of a boron rich semiconductor homojunction diode according to the present invention with the schematic cross-sectional geometry of the diode shown in the inset.

FIG. 6 shows the I-V characteristics and corresponding schematic diagram of a trilayer diode that has been fabricated from a PECVD nickel doped $B_5C$ layer deposited on an undoped PECVD $B_5C$ layer, with a semiconductor homojunction formed therebetween. The undoped PECVD $B_5C$ layer was deposited on a PECVD rhomboherdal boron layer placed on an aluminum substrate. Other dopants that may be employed include, for example, phosphorous, chromium, manganese, iron, cobalt, and ruthenium.

Because boron has a very high neutron capture cross-section (400 barns for $^{11}B$ and 4000 barns for $^{10}B$), the semiconductor devices according to the present invention may be advantageously employed as solid state neutron detectors. By inclusion, enrichment, or replacement of the natural isotope abundance of boron with the $^{10}B$ isotope, neutron capture cross-section is improved and the neutron detector device made more effective. Multiple detectors may be formed into an array, or, many layers of the boron/boron carbide diodes in accordance with the present invention may be stacked to provide a neutron calorimeter to measure both neutrons and their energy. Neutron detectors employing the boron/boron carbide semiconductor devices in accordance with the present invention may be used for monitoring the operation of nuclear reactors, monitoring spent nuclear fuel, monitoring weapons storage, and for neutron scattering.

The boron/boron carbide semiconductor devices according to the present invention also find utility as sensors for hot oil wells. Currently, MOS device packages are used to measure the temperature of hot oil wells. At present, 82% of well logging equipment applications require operation up to 200° C., with the remaining 18% requiring operation up to 260° C. Newer markets in deeper and thus hotter wells requires operation up to 400° C. The boron/boron carbide semiconductor devices according to this teaching have been found to operate reliably at temperatures up to 560° C., thus making them well-suited for use in such applications.

The boron/boron carbide semiconductor devices according to the present invention may also be used in aerospace applications. The harsh environment of the engine requires current electronics to operate in temperatures up to 250° C. Recent applications of high temperature electronics include SiC photodiodes as flame indication sensors, but all of the devices require external cooling jackets to operate. Elimination of these cooling jackets would lead to decreases in the size and weight of sensor packages and decreased engine emissions and pollutants.

The boron/boron carbide semiconductor devices may also be used in "smart-skin" applications. Since the semiconducting material of the present invention may be deposited directly on titanium, such materials can be used in the transmit and receive circuits of radar, and arrays of such circuits can be "painted" directly on an airframe assembly for use in radar. The semiconductor devices prepared in accordance with the present invention are robust and operate at high temperatures and thus are well suited to high power applications of this type.

The boron/boron carbide devices in accordance with this teaching may also be used as sensors in automobile engines. Sensors in car engines currently do not exceed 100° C., however, direct control of the engine, transmission, antilock braking system, and manifold absolute pressure is expected to increase the temperature requirements.

The boron/boron carbide devices in accordance with the present invention may also be used as "throw-away" sensors in forms used in the fabrication of steel parts. The problem with steel form sensors is that molten steel is very corrosive and as a result very few sensors work in contact with molten steel. Such sensors are used to make sure the molten steel fills all parts of the form, in particular parts where vapor tends to get trapped as the molten steel is poured into the form.

The description above should not be construed as limiting the scope of the invention, but as merely providing illustrations to some of the presently preferred embodiments of this invention. In light of the above description and examples, various other modifications and variations will now become apparent to those skilled in the art without departing from the spirit and scope of the present invention as defined by the appended claims. Accordingly, the scope of the invention should be determined solely by the appended claims and their legal equivalents.

All references cited herein are expressly incorporated by reference in their entireties.

REFERENCES

[1] H. E. Robson, Ph.D. dissertation, University of Kansas (1959).
[2] S. Lee and P. A. Dowben, *J. Appl. Phys.* A58, 223 (1994).
[3] S. Lee, J. Mazurowski, G. Ramseyer and P. A. Dowben, *J. Appl. Phys.* 72, 4925 (1992).
[4] J. C. Lund, F. Olschner, F. Ahmed and K. S. Shah, *Mat. Sci. Soc. Symp. Proc.* 162, 601 (1990).
[5] Dongjin Byun, S. Hwang, P. A. Dowben, F. K. Perkins, F. Filips and N. J. Ianno, *Appl. Phys. Lett.* 64, 1968 (1994).
[6] Dongjin Byun, B. R. Spady, N. J. Ianno and P. A. Dowben, *Nanostructured Materials* 5, 465 (1995).
[7] J. Mazurowski, S. Baral-Tosh, G. Ramseyer, J. T. Spencer, Y.-G. Kim and P. A. Dowben, in *Plasma Processing and Synthesis of Materials, MRS Symposium Proceedings,* edited by D. Apelian and J. Szekely (MRS, Pittsburgh, Pa. 1991), vol.190, p.101; J. Mazurowski, S. Lee, G. Ramseyer and P. A. Dowben, in *Wide Band Gap Semiconductors MRS Symposium Proceedings,* edited by T. D. Moustakas, J. I. Pankove and Y. Hamakawa (MRS, Pittsburgh, Pa. 1992), vol.242, p.637.
[8] F. K. Perkins, R. A. Rosenberg, S. Lee and P. A. Dowben, *J. Appl. Phys.* 69, 4103 (1991).
[9] R. A. Rosenberg, F. K. Perkins, D. C. Mancini, G. R. Harp, B. F. Tonner, S. Lee and P. A. Dowben, *Appl. Phys. Lett.* 58, 607 (1991).
[10] A. P. Hitchcock, A. T. Wen, S. Lee, J. A. Glass, J. T. Spencer and P. A. Dowben, *J. Phys. Chem.* 97, 8171 (1993).
[11] S. Lee, J. Mazurowski, G. Ramseyer, and P. A. Dowben, *J. Appl. Phys.,* 72, 4925 (1992).
[12] S. Lee and P. A. Dowben, *J. Appl. Phys.* A58, 223 (1994); S. Lee, T. Ton, D. Zych and P. A. Dowben, *Mater. Res. Soc. Symp. Proc.* 283, 483 (1993).
[13] Seong-Don Hwang, Dongjin Byun, N. J. Ianno, P. A. Dowben, and H. R. Kim, *Appl. Phys. Lett.* 68(11), 1495 (1996).
[14] D. Byun, B. R. Spady, N. J. Ianno, and P. A. Dowben, *Nanostructured Mat.* 5, 465 (1995).
[15] D. Byun, S.-D. Hwang, P. A. Dowben, F. K. Perkins, F. Filips and N. J. Ianno, *Appl. Phys. Lett.* 64, 1968 (1994).
[16] D. N. McIlroy, Jiandi Zhang, P. A. Dowben, P. Xu and D. Heskett, *Surface Science* 328, 47 (1995).
[17] D. N. McIlroy, J. Zhang, P. A. Dowben and D. Heskett, *Mat. Sci. Eng.* (1996), in press.
[18] L. F. Warren, and M. F. Hawthorne, *J. Am. Chem. Soc.* 90, 4823 (1990); L. F. Warren, and M. F. Hawthorne, *J. Am. Chem. Soc.* 92, 1157 (1970); M. F. Hawthorne, D. C. Young, T. D. Andrews, D. V. Howe, R. L. Pillings, A. D. Pitts, M. Reintjes, L. F. Warren and P. A. Wegner, *J. Am. Chem. Soc.* 90, 879 (1968); K. Y. Callahan and M. F. Hawthorne, *Adv. Organometallic Chem.* 14, 145 (1976).
[19] K. Widder, D. Berner, A. Zibold, H. P. Geserich, M. Knupper, M. Kielwein, M. Buchgeister and J. Fink, *Europhys. Lett.* 30, 55 (1995); R. J. Cava, B. Batlogg, J. J. Krajewski, W. F. Peck, T. Siegrist, R. M. Fleming, S. Carter, H. Takagi, R. J. Felder, R. B. van Dover and L. W. Rupp, *Physica C,* 226, 170 (1994); T. Siegrist, H. W. Zandbergen, R J. Cava, J. J. Krajewski and W. F. Peck, *Nature* 367, 254 (1994); R. J. Cava, H. Takagi, H. W. Zandbergen, J. J. Krajewski, W. F. Peck, T. Siegrist, B. Batlogg, R. B. van Dover, R. J. Felder, K. Mizuhashi, J. O. Lee, H. Eisaki and S. Uchida, *Nature* 367,252 (1994); R. Nagarajan, C. Mazumdar, Z. Hossain, S. K. Dhar, K. V. Gopalakrishnan, L. C. Gupta, C. Godart, B. D. Padalia, and R. Vijayaraghavan, *Phys. Rev. Lett.* 72, 274 (1994).
[20] N. Kobayashi, Y. Kumashiro, P. Revesz, J. Li, and J. W. Mayer, *Mater. Res. Soc. Symp. Proc.* 162, 595 (1990).
[21] N. Kobayashi, Y. Kumashiro, P. Revesz, J. Li, and J. W. Mayer, *Appl. Phys. Lett.* 54, 1914 (1989).
[22] Y.-G. Kim, D. Byun, C. Hutchings, P. A. Dowben, H. Hejasi, and K. Schroeder, *J. Appl. Phys.* 70, 6062 (1991); G. T. Stauf, and P. A. Dowben, *Thin Solid Films* 156, L31 (1988); G. T. Stauf, D. C. Driscoll, P. A. Dowben, S. Barfuss, and M. Grade, *Thin Solid Films,* 153, 421 (1987).
[23] N. M. Boag and P. A. Dowben, *Metallized Plastics 4: Fundamental and Applied Aspects,* Edited by K. L. Mittal, Plenum Press, New York (1996); D. Zych, A. Patwa, S. S. Kher, J. T. Spencer, J. Kushneir, A. J. Goodby, N. M. Boag and P. A. Dowben, *J. Appl. Phys.* 76, 3684 (1994).
[24] T. P. Brody, *J. Appl. Phys.* 38, 2384 (1967); E. O. Kane, *J. Appl. Phys.* 32, 83 (1961); E. O. Kane, *Phys. Chem. Solids* 2, 181 (1960); A. G. Chynoweth, W. L. Feldmann and R A. Logan, *Phys. Rev.* 121, 684 (1961); R A. Logan and A. G. Chynoweth, *Phys. Rev.* 131, 89 (1963), R. S. Claassen, *J. Appl. Phys.* 32, 2372 (1961); A. S. Epstein and J. F. Caldwell, *J. Appl. Phys.* 35, 3050 (1964); D. Meyerhofer, G. A. Brown and H. S. Sommers Jr., *Phys. Rev.* 126, 1329 (1962); R. M. Minton, and R. Glicksman, *Solid State Electron* 7, 491 (1964); J. Karlovsky, *Solid State Electron* 10, 1109 (1967).
[25] H. Werheit, U. Kuhlmann, M. Laux and T. Lundstrøm, *Phys. Stat. Sol.* 179, 489 (1993).
[26] H. Werheit, M. Laux, and U. Kuhlmann, *Phys. Stat. Sol.* 176, 415 (1993).
[27] Seong-Don Hwang, N. B. Remmes, P. A. Dowben, and D. N. McIlroy, *J. Vacuum Sci. & Tech. B* 14(4), 2957, 1996.

What is claimed is:

1. A process for preparing a semiconductor device comprising the steps of:

forming a first layer of substrate material, said substrate material comprising a metal or semiconductor material;

depositing a second layer comprising elemental boron on said first layer; and depositing a third layer comprising boron carbide on said second layer.

2. A process according to claim 1, wherein said first layer is selected from the group consisting of aluminum, silver, titanium, n-type silicon [1,1,1], and p-type Si [1,1,1].

3. A process according to claim 1, wherein said first layer is selected from the group consisting of aluminum, silver, n-type silicon [1,1,1], and p-type Si [1,1,1].

4. A process according to claim 1, wherein said second layer is substantially pure boron.

5. A process according to claim 1, wherein the molar ratio of boron and carbon in said boron carbide is about 5.

6. A process for preparing a semiconductor device comprising the steps of:

forming a first layer of substrate material, said substrate material comprising a metal or semiconductor material; and depositing a second layer comprising elemental boron and a dopant on said first layer, wherein said dopant is selected from the group consisting of phosphorous, nickel, chromium, manganese, iron, cobalt, and ruthenium.

7. A process according to claim 6, wherein said dopant is phosphorous.

8. A process according to claim 7, wherein said second layer is formed by chemical vapor deposition from dimeric chloro-phospha(III)carborane.

9. A process according to claim 6, wherein said dopant is selected from the group consisting of nickel, chromium, manganese, iron, cobalt, and ruthenium.

10. A process according to claim 6, wherein said dopant is nickel.

11. A process for preparing a semiconductor device comprising the steps of:

forming a first layer of substrate material, said substrate material comprising a metal or semiconductor material;

depositing a second layer comprising elemental boron on said first layer;

depositing a third layer comprising boron carbide on said second layer; and depositing a fourth layer comprising boron carbide and a dopant on said third layer, said dopant selected from the group consisting of phosphorous, nickel, chromium, manganese, iron, cobalt, and ruthenium.

12. A process according to claim 11, wherein said dopant is phosphorous.

13. A process according to claim 12, wherein said second layer is formed by chemical vapor deposition from dimeric chloro-phospha(III)carborane.

14. A process according to claim 11, wherein said dopant is selected from the group consisting of nickel, chromium, manganese, iron, cobalt, and ruthenium.

15. A process according to claim 11, wherein said dopant is nickel.

16. A process according to claim 15, wherein said substrate material comprises aluminum.

17. A process according to claim 15, wherein said substrate is silicon [1,1,1].

18. A process for introducing a metal as a dopant in a boron carbide layer deposited onto a suitable substrate comprising the steps of:

supplying into a chamber that contains the substrate a gaseous mixture of orthocarborane and an organometallic compound comprising the metal;

energizing the gaseous mixture in the chamber sufficiently to dissociate boron and carbon atoms and metal atoms which combine to form a metal doped boron carbide layer on said substrate.

19. A process according to claim 18, wherein said organometallic compound is a metallocene.

20. A process according to claim 18, wherein said organometallic compound is selected from the group consisting of nickelocene, nickel carbonyl, chromocene, manganocene, ferrocene, cobaltocene, and ruthenocene.

21. A process according to claim 18, wherein said organometallic compound is nickelocene.

22. A process according to claim 21, wherein nickelocene and orthocarborane are supplied to provide a partial pressure ratio of nickelocene to orthocarborane of from about 0.1 to about 10.

23. A process for introducing a phosphorous as a dopant in a boron carbide layer deposited onto a suitable substrate comprising the steps of:

supplying gaseous dimeric chloro-phospha(III)carborane into a chamber that contains the substrate;

energizing the gaseous mixture in the chamber sufficiently to dissociate boron, carbon, and phosphorous atoms which combine to form a phosphorous doped boron carbide layer on said substrate.

* * * * *